United States Patent [19]

Shimura

[11] Patent Number: 5,212,103
[45] Date of Patent: May 18, 1993

[54] METHOD OF MAKING A HETEROJUNCTION BIPOLAR TRANSISTOR

[75] Inventor: Teruyuki Shimura, Itami, Japan
[73] Assignee: Mitsubishi Denki Kabushiki Kaisha, Tokyo, Japan
[21] Appl. No.: 763,155
[22] Filed: Sep. 20, 1991

Related U.S. Application Data

[62] Division of Ser. No. 481,619, Feb. 20, 1990, Pat. No. 5,073,812.

[30] Foreign Application Priority Data

May 11, 1989 [JP] Japan .................................. 1-118194

[51] Int. Cl.⁵ .......................................... H01L 29/72
[52] U.S. Cl. ........................................ 437/31; 437/164
[58] Field of Search ................................. 437/37, 164

[56] References Cited

U.S. PATENT DOCUMENTS

| | | | |
|---|---|---|---|
| 4,679,305 | 7/1987 | Morizuka | 29/576.3 |
| 4,889,831 | 12/1989 | Ishii et al. | 437/31 |
| 4,924,283 | 5/1990 | Ohshima | 357/16 |
| 4,929,997 | 5/1990 | Honjo et al. | 357/16 |
| 4,933,732 | 6/1990 | Katoh et al. | 357/16 |
| 4,958,208 | 9/1990 | Tanaka | 357/16 |
| 4,967,254 | 10/1990 | Shimura | 357/34 |
| 4,982,244 | 1/1991 | Kapoor | 357/67 |
| 4,996,168 | 2/1991 | Ozaki et al. | 437/164 |

FOREIGN PATENT DOCUMENTS 63-1066  1/1988 Japan .
63-276267 11/1988 Japan .
188964   7/1990 Japan ............................. 437/31

OTHER PUBLICATIONS

"High-Speed Semiconductor Devices", edited by S. M. Sze, John Wiley & Sons, Inc., 1990, pp. 375-376.
"Fully Self-Aligned Heterostructure Bipolar Junction Transistor" IBM Technical Disclosure Bulletin, vol. 31, No. 7, Dec. 1988, pp. 61-68.
Tiwari et al, "Symmetric-Gain, Zero-Offset, Self-Aligned, And Refractory-Contact Double HBT's", IEEE Electron Device Letters, vol. EDL-8, No. 9, Sep. 1987, pp. 417-420.
"Integrated Schottky Diodes In HBT Technology", IBM Technical Disclosure Bulletin, vol. 31, No. 4, Oct. 1988, pp. 1-3.
Nagata et al, "Self-Aligned . . . Cap Layer", IEEE Transactions on Electron Devices, vol. ED-35, No. 1, Jan. 1988, pp. 2-7.
Morizuki et al, "Self-Aligned . . . Double Implantation", Conference on Solid State Devices and Materials, Tokyo 1986, pp. 359-362.

*Primary Examiner*—Olik Chaudhuri
*Assistant Examiner*—Lang Pham
*Attorney, Agent, or Firm*—Leydig, Voit & Mayer

[57] ABSTRACT

A semiconductor device includes an n+ type InGaAs layer at a surface of the device, a refractory metal emitter electrode making ohmic contact to the n+ layer without alloying and an externally accessible base region produced in the neighborhood of the emitter electrode by diffusion using the emitter electrode and an insulating side wall film as a diffusion mask.

15 Claims, 6 Drawing Sheets

METHOD OF MAKING A HETEROJUNCTION BIPOLAR TRANSISTOR

This application is a division of application Ser. No. 07/481,619, filed Feb. 20, 1990, now U.S. Pat. No. 5,073,812.

FIELD OF THE INVENTION

The present invention relates to a semiconductor device and a production method therefor and, more particularly, to enhancing the efficiency and uniformity of the device.

BACKGROUND OF THE INVENTION

FIGS. 3(a) to 3(g) illustrate a prior art method of producing a heterojunction bipolar transistor (HBT). In FIG. 3(a), an n -type GaAs sub-collector layer 2 having a thickness of about 5,000 Angstroms and an impurity concentration of $5 \times 10^{18}$ cm$^{-3}$ is disposed on a semi-insulating GaAs substrate 1. An n-type GaAs collector layer 3 having a thickness of about 5,000 Angstroms and an impurity concentration of about $5 \times 10^{16}$ cm$^{-3}$ is disposed on the n$^+$-type GaAs layer 2. A p$^+$-type GaAs base layer 4 having a thickness of about 1,000 Angstroms and an impurity concentration of about $1 \times 10^{19}$ cm$^{-3}$ is disposed on the n-type GaAs layer 3. A grading layer 5a is disposed between the p-type GaAs layer 4 and an emitter layer 5 and comprises n-type Al$_x$Ga$_{1-x}$As, where x gradually varies from 0 to 0.3 in the direction of the emitter layer 5. The grading layer 5a has a thickness of about 500 Angstroms and an impurity concentration of about $3 \times 10^{17}$ cm$^{-3}$. An n-type Al$_{0.3}$Ga$_{0.7}$As emitter layer 5 having a thickness of about 1,000 Angstroms and an impurity concentration of about $3 \times 10^{17}$ cm$^{-3}$ is disposed on the grading layer 5a. A second grading layer 5b is disposed between the emitter layer 5 and an emitter cap layer 6. The grading layer 5b comprises n-type Al$_x$Ga$_{1-x}$As, where x gradually varies from 0.3 to 0 in the direction of the emitter cap layer 6, having a thickness of about 500 Angstroms and an impurity concentration of about $3 \times 10^{17}$ cm$^{-3}$. The emitter cap layer 6, comprising n$^+$-type GaAs, has a thickness of about 2,000 Angstroms, an impurity concentration of about $5 \times 10^{18}$ cm$^{-3}$, and is disposed on the grading layer 5b.

In FIG. 3(b), an emitter electrode dummy pattern 7 formed of a first insulating film, such as SiON or SiN, has a thickness of about 5,000 Angstroms. A p-type external base region 8 is produced by ion implantation of Mg$^+$ ions to a depth of about 3,000 Angstroms and an impurity concentration of about $5 \times 10^{18}$ cm$^{-3}$.

In FIG. 3(c), a second insulating film 9 comprises SiO and has a thickness of about 3,000 Angstroms. An insulating region 10 produced by ion implantation of B$^+$ ions or H$^+$ ions has a depth of about 11,000 Angstroms.

In FIG. 3(d)), a side wall 11 is produced by reactive ion etching (RIE) of the second insulating film 9.

The structure of FIGS. 3(e) and 3(f) includes a base electrode resist pattern 12 and base electrode metal, such as AuZn, 13 and 13a.

In FIG. 3(g), a first or second insulating film 14 is flattened using photoresist and uniform speed etching of the photoresist and the insulating film by RIE. An emitter electrode 15, such as an AuGe alloy, is also shown in FIG. 3(g).

The structure shown in FIG. 3(a) is produced by molecular beam epitaxy (MBE) or metal organic chemical vapor deposition (MOCVD).

As shown in FIG. 3(b), a first insulating film comprising SiON or SiN is deposited on the entire surface of the structure shown in FIG. 3(a), and the insulating film is patterned by photolithography to produce a dummy pattern 7 for the emitter electrode. Then, the n$^+$-type GaAs emitter cap layer 6 is wet etched with a solution of sulfuric acid, hydrogen peroxide, and water using the dummy pattern 7 as a mask. Next, Mg$^+$ ions are ion implanted using the dummy pattern 7 as a mask, and an external base region 8 having a depth of about 3,000 Angstroms and an impurity concentration of about $5 \times 10^{18}$ cm$^{-3}$ is produced.

In FIG. 3(c), the second insulating film 9 comprising SiO is deposited on the entire surface of a wafer and, thereafter, B$^+$ or H$^+$ ions are implanted using a photoresist pattern as a mask. An insulating region 10 having a depth of about 11,000 Angstroms is produced.

As shown in FIG. 3(d)), the second insulating film 9 comprising SiO is etched by RIE using a mixture of C$_2$F$_6$+CHF$_3$+O$_2$+He whereby a side wall 11 is produced. When the second insulating film comprises SiN, a mixture of CHF$_3$+O$_2$ is used in the RIE. The etching is conducted under conditions of temperature, gas mixture ratios, and the like so that the first insulating film pattern 7 is not etched.

As shown in FIG. 3(e), a photoresist pattern 12 is deposited and a metal 13, such as AuZn, is vapor deposited on the entire surface. Base electrodes 13a are produced using the photoresist pattern 12 and the first insulating film pattern 7 as a mask, separated from the emitter cap layer by distances corresponding to the thickness of the side wall 11.

As shown in FIG. 3(f), the photoresist pattern 12, the first insulating film pattern 7, and the side wall 11 are removed by etching with hydrofluoric acid. Unnecessary material 13 is also removed. A collector electrode 40 is also present.

As shown in FIG. 3(g), a first or second insulating film 14 is deposited on the entire surface, and a photoresist is deposited thereon to flatten the surface. Thereafter, equal speed etching of the photoresist and the insulating film 14 by RIE exposes the head portion of the emitter cap layer 6, thereby flattening the insulating film 14. An emitter electrode metal 15 comprising an AuGe alloy is deposited on the exposed portion of the emitter cap layer 6.

In the prior art method of producing an HBT, implanted Mg$^+$ ions connect the base region to the surface and produce a base electrode at the surface of the device. In ion implantation, however, the impurity concentration of the external base region 8 is low, about $5 \times 10^{18}$ cm$^{-3}$ at the most, and it is impossible to significantly reduce the external base resistance.

When producing an emitter electrode, surface flattening and exposure of the emitter cap layer by equal speed RIE of the photoresist and insulating film exploit a step produced by the emitter cap layer 6. Therefore, the reproducibility of the process and uniformity of the product are poor.

The emitter cap layer 6 is an n$^+$-type GaAs layer and is required to have a step of about 2,000 to 3,000 Angstroms in height. Further, this step is produced by wet etching. Therefore, the reproducibility and uniformity of the emitter width are poor due to variations in wet etching and precision patterning of the emitter width is difficult.

When the base electrode parts 13a are spaced from the emitter by distances equal to the thickness of the side wall, the spacing between the base electrode metal 13 and the emitter electrode dummy pattern 7 is difficult to control. This lack of control reduces yield.

SUMMARY OF THE INVENTION

An object of the present invention is to provide a semiconductor device with reduced base resistance, precision emitter electrode patterning, and enhanced speed and integration ability that has superior reproducibility and uniformity of electrical characteristics.

It is another object of the present invention to provide a method of producing such a semiconductor device.

Other objects and advantages of the present invention will become apparent from the detailed description given hereinafter. The detailed description and specific embodiments are provided for illustration only, since various additions and modifications within the spirit and scope of the invention will become apparent to those of skill in the art from the detailed description.

According to an aspect of the present invention, an n+-type InGaAs layer is deposited on a surface of the device so that an ohmic contact emitter electrode can employ a non-alloying refractory metal. Therefore, a narrow emitter electrode can be precisely patterned, enhancing the speed of the device and its integration density. Furthermore, since an external base region is self-aligningly produced using the emitter electrode and its side wall as a mask, the base resistance can be reduced, improving device performance.

According to another aspect of the present invention, since flattening and exposure of the emitter electrode are carried out by electron cyclotron resonance chemical vapor deposition (ECR CVD), a low resistance metal can be deposited on the refractory metal emitter electrode. Therefore, the emitter resistance is reduced, improving device performance. Furthermore, since the flattening and exposure of the emitter electrode is carried out by ECR CVD, processes performed later, such as wiring, are simplified, improving the integration density of the device.

DETAILED DESCRIPTION OF THE PREFERRED EMBODIMENTS

Figure 1A:
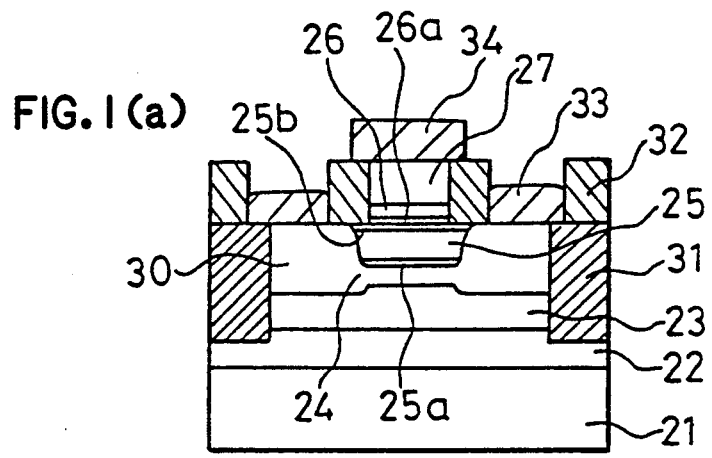
FIGS. 1(a) and 1(b) are a cross-sectional view and a plan view of a semiconductor device according to an embodiment of the present invention.
Figure 1B:
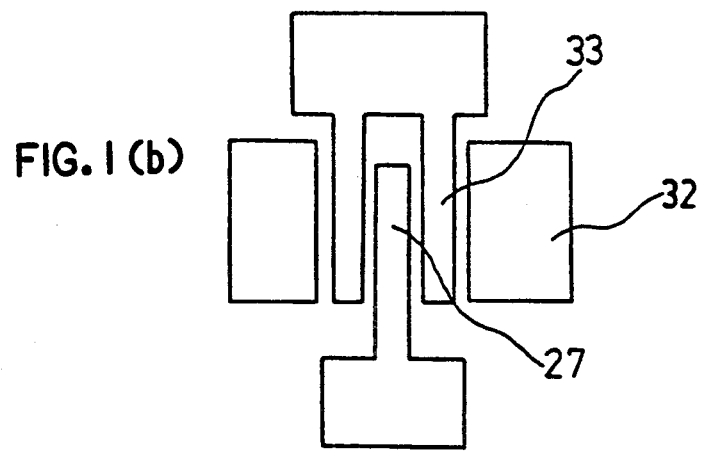

FIGS. 1(a) and 1(b) respectively show cross-sectional and plan views of an HBT according to an embodiment of the present invention, and FIGS. 2(a) to 2(g) illustrate a production process therefor.

In FIG. 1(a), reference numeral 21 designates a semi-insulating GaAs substrate. An n+-type GaAs sub-collector layer 22 having a thickness of about 5,000 Angstroms and an impurity concentration of $5 \times 10^{18}$ cm$^{-3}$ is disposed on the substrate 21. An n-type GaAs collector layer 23 having a thickness of about 5,000 Angstroms and an impurity concentration of about $5 \times 10^{16}$ cm$^{-3}$ is disposed on the n+-type GaAs layer 22. A p+-type Al$_x$Ga$_{1-x}$As base layer 24, where x gradually varies from 0 to 0.1 opposite layer 23, having a thickness of about 1,000 Angstroms and an impurity concentration of about $1 \times 10^{19}$ cm$^{-3}$ is disposed on the n-type GaAs layer 23.

An n-type Al$_{0.3}$Ga$_{0.7}$As emitter layer 25 has a thickness of about 1,000 Angstroms and an impurity concentration of about $3 \times 10^{17}$ cm$^{-3}$. An n-type Al$_x$Ga$_{1-x}$As grading layer 25a, where x gradually varies from 0.1 to 0.3 opposite layer 25, is disposed between the base layer 24 and the emitter layer 25 and has a thickness of about 300 Angstroms and an impurity concentration of about $3 \times 10^{17}$ cm$^{-3}$. An n-type Al$_x$Ga$_{1-x}$As grading layer 25b, where x gradually varies from 0.3 to 0 opposite layer 25, is disposed between the emitter layer 25 and an emitter cap layer 26 and has a thickness of about 300 Angstroms and an impurity concentration of about $3 \times 10^{17}$ cm$^{-3}$. An n+-type In$_{0.5}$Ga$_{0.5}$As emitter cap layer 26 for producing an ohmic contact without alloying has a thickness of about 500 Angstroms and an impurity concentration of about $2 \times 10^{19}$ cm$^{-3}$.

An n+-type In$_x$Ga$_{1-x}$As grading layer 26a, where x gradually varies from 0 to 0.5 opposite layer 25b, is disposed between the emitter layer 25 and has a thickness of about 300 Angstroms and an impurity concentration of about $2 \times 10^{19}$ cm$^{-3}$. An emitter electrode 27 comprises a refractory metal or compound, such as W or WSi, and has a thickness of about 3,000 Angstroms. An external base region 30 is produced by diffusion of a dopant producing p-type conductivity, such as Zn, has a depth of about 3,000 Angstroms and an impurity concentration of about $2 \times 10^{19}$ cm$^{-3}$.

An insulating region 31 produced by ion implantation of B+ or H+ has a depth of 1,000 Angstroms. An insulating film 32 is produced by ECR CVD for surface flattening and exposure of the emitter electrode 27. A base electrode 33 comprising AuZn or Ti/Mo/Au is serially deposited on the external base 30, and a low resistance metal 34, such as Ti/Au, is disposed on the emitter electrode 27.

In FIGS. 2(a)-2(g), the same reference numerals designate the same or corresponding elements as those shown in FIGS. 1(a)-1(b). An insulating film 28, such as SiO, is disposed on the side surfaces of the emitter electrode 27 and on the emitter cap layer 26 comprising n+-type In$_{0.5}$Ga$_{0.5}$As. A doped oxide film 29, such as ZnO SiO$_2$, having a Zn concentration of about 70% is a solid phase diffusion source.

Figure 2A:
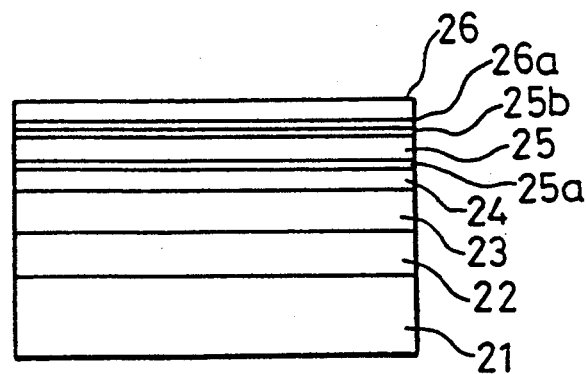
FIGS. 2(a) to 2(g) are cross-sectional views illustrating steps for producing the semiconductor device shown in FIG. 1(a)
Figure 2B:
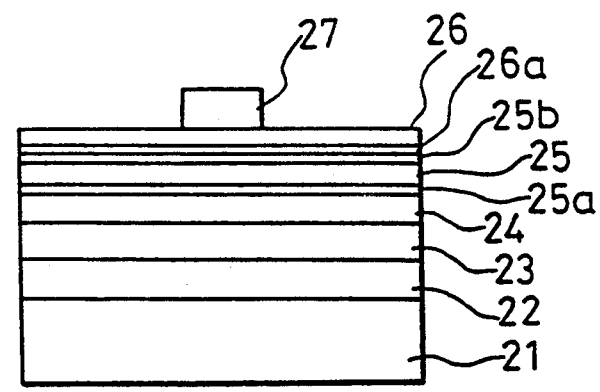

The epitaxially grown structure shown in FIG. 2(a) is produced by MBE or MOCVD. As shown in FIG. 2(b), a refractory metal, such as WSi, is sputtered on the entire surface, and the sputtered film is etched by a reactive ion etching using a mixture of CF$_4$+O$_2$, thereby producing an emitter electrode 27 on the n+-type InGaAs layer 26.

Since the dopant concentration in the n+-type InGaAs layer 26 is high, for example, above $1 \times 10^{19}$ cm$^{-3}$, even when a refractory metal, such as WSi, is used for the emitter electrode 27, it is possible to achieve a low contact resistance without alloying, that is, without annealing. Because the emitter electrode 27 is produced by sputtering and subsequent RIE, precise, narrow patterning is quite easy.

Figure 2C:
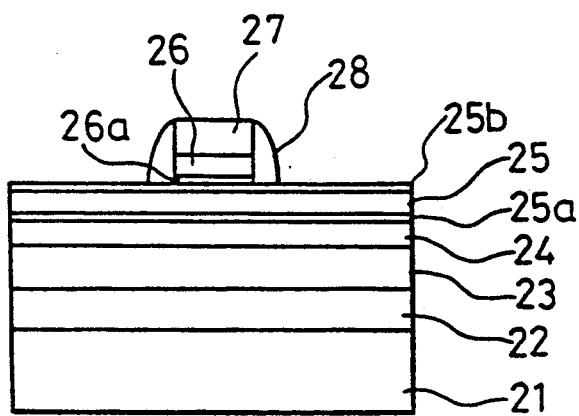

In FIG. 2(c), only the n+-type InGaAs layer 26 at the upper surface is wet etched or dry etched using a chlorine compound gas. When wet etching is employed using concentrated HCl which is heated to about 60° C. as an etchant, the n+-type InGaAs layer 26 is selectively etched without etching the lower n-type AlGaAs layer 25.

Next, a side wall 28 is produced at the side surfaces of the emitter electrode 27 and on the emitter cap layer 26. This side wall can be formed by depositing SiO on the entire surface and leaving the SiO only at the side surfaces of the emitter cap layer 26 and on the emitter electrode 27 after anisotropic etching, such as RIE, using a mixture of $C_2F_6+CHF_3+O_2+He$.

SiO is used for the side wall because it is difficult to deposit SiN. Because SiO sometimes is not effective as a diffusion mask, it is better to produce an SiN layer underlying a layer of SiO. This SiN underlying layer is patterned by RIE using a mixture of $CHF_3+O_2$.

Figure 2D:
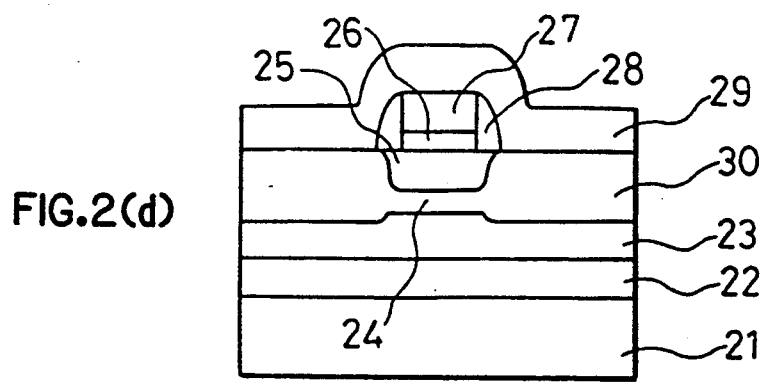

In FIG. 2(d)), a doped oxide such as ZnO $SiO_2$ 29 is deposited on the entire surface by a sputtering or the like. Then, by annealing, a dopant producing p-type conductivity, such as Zn, is selectively diffused (solid phase diffusion) into the structure using the emitter electrode 27 and the side wall 28 as masks, thereby producing an external base region 30. Although it is not shown in the figure, double layer films, including SiO and SiN, are disposed only where diffusion is not required. These double layer films are produced by the RIE technique during production of the side wall films.

The diffusion is carried out in a diffusion furnace at a temperature of 500° C. to 700° C. for tens of minutes. Since the emitter electrode 27 includes a refractory metal, such as WSi, that has a melting point above 1,000° C., it will not melt during the diffusion. On the other hand, the external base region 30 has an impurity concentration of above $1\times10^{19}$ cm$^{-3}$, and, therefore, it is impossible to achieve a low resistance external base region.

Figure 2E:
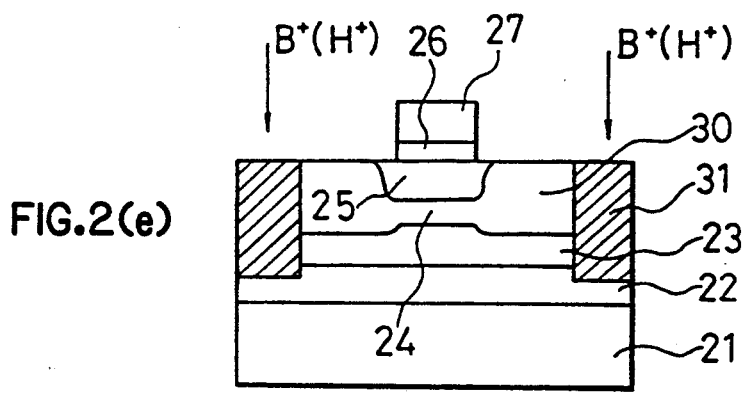

In FIG. 2(e), B+ or H+ is implanted using photoresist as a mask to make the unneeded portion of the external base region 30 insulating, and an insulating region 31 having a depth of about 1,000 Angstroms is produced. This insulating region reduces parasitic capacitances.

Figure 2F:
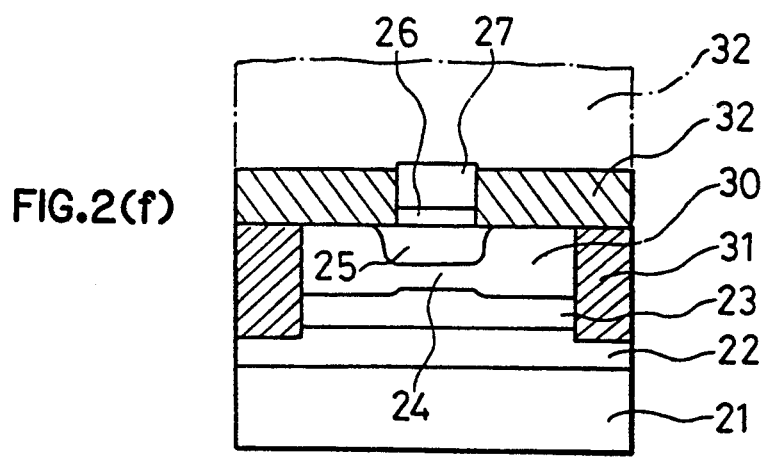

In FIG. 2(f), after removing the photoresist, an insulating film 32 is deposited on the entire surface of the emitter electrode 27 by ECR CVD to flatten the surface. Sputtering is conducted in the ECR CVD apparatus using Ar gas while monitoring the thickness of the insulating film 32, thereby flattening the upper surface and exposing the emitter electrode 27.

Figure 2G:
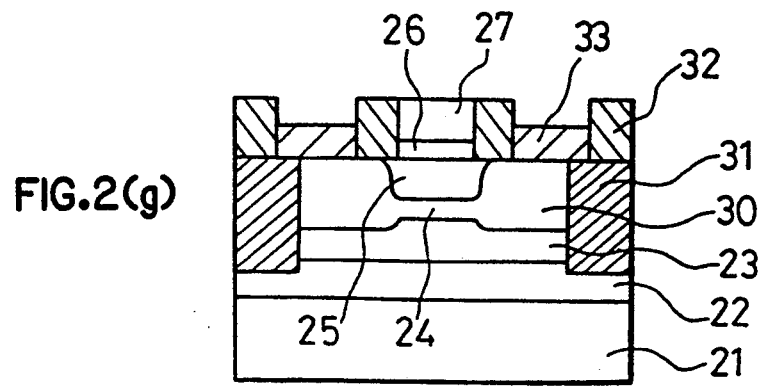
Figure 3A:
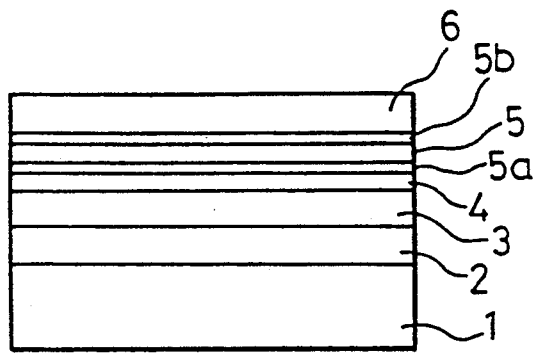
FIGS. 3(a) to 3(g) are cross-sectional views illustrating steps for producing a semiconductor device according to the prior art.
Figure 3B:
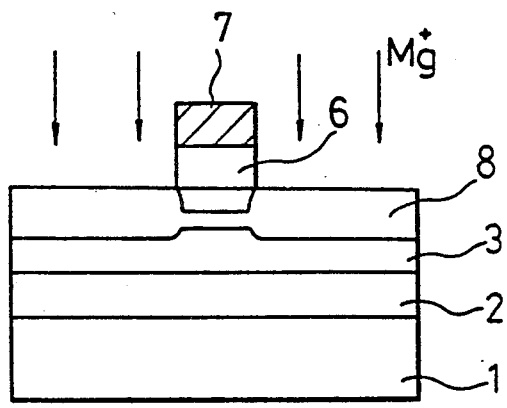
Figure 3C:
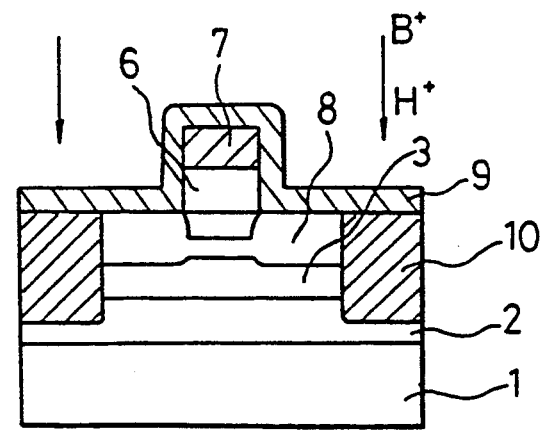
Figure 3D:
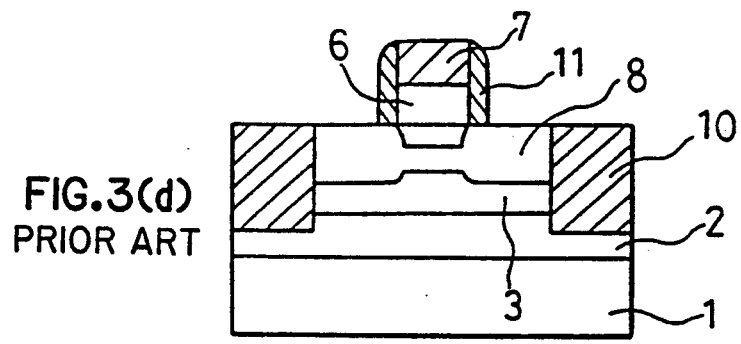
Figure 3E:
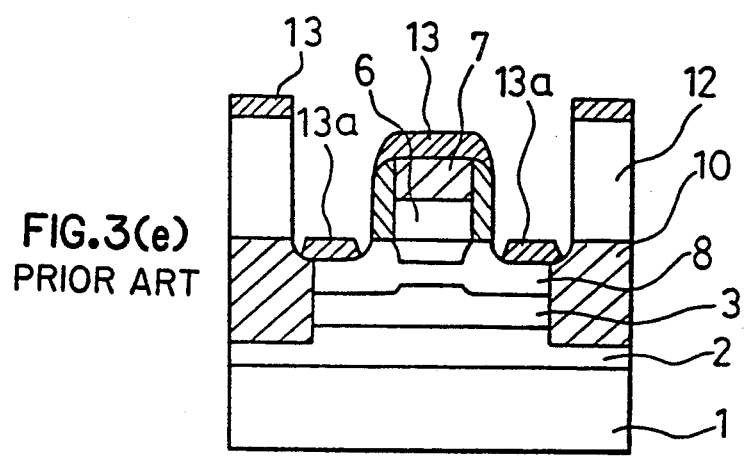
Figure 3F:
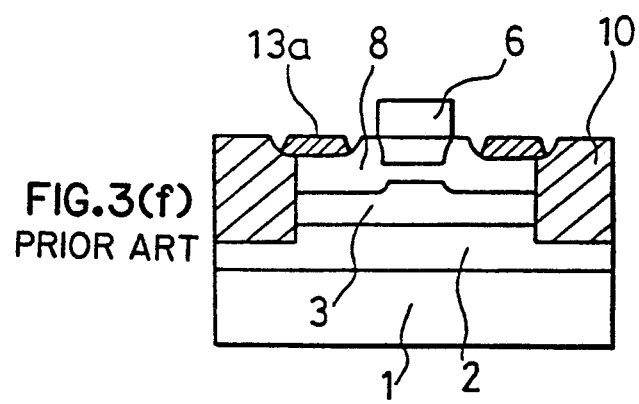
Figure 3G:
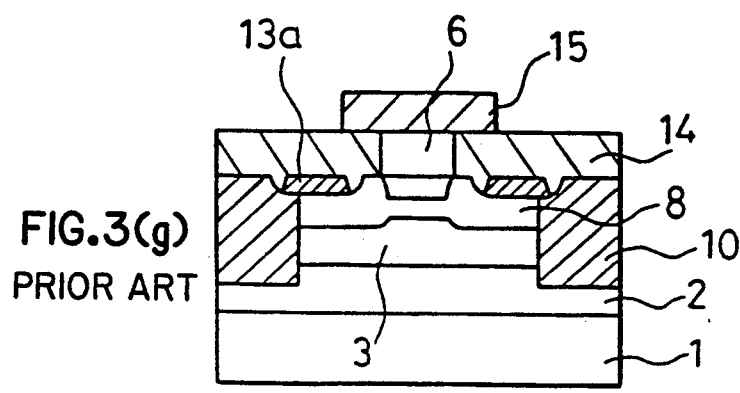

In FIG. 2(g), a desired portion of the insulating film 32, which is flattened using the photoresist as a mask, is removed by RIE and a p-type ohmic electrode (base electrode) 33 is produced by evaporation and condensation of the electrode metals and removal of the excess electrode metals by liftoff. This base electrode 33 is an alloy, such as AuZn, that is sintered at a temperature of 450° C. for two minutes.

Since the impurity concentration of the external base region 30 at the surface is $2\times10^{19}$ cm$^{-3}$, a low contact resistance can be obtained even if a non-alloying ohmic electrode, such as Ti/Mo/Au, deposited in that order, is employed as the base electrode.

Next, as shown in FIG. 1(a), a low resistance metal 34, such as Ti/Au, is deposited on the emitter electrode 27 by evaporation and lift-off. This low resistance metal reduces the resistance of the emitter electrode.

In this embodiment, the refractory metal emitter electrode can be precisely and uniformly patterned with high reproducibility by selective etching of the n+-type InGaAs layer. An ohmic contact to the emitter electrode can be made without alloying the refractory metal. Since dopants producing p-type conductivity are selectively diffused using the refractory metal as a mask, thereby self-aligningly producing an external base region having a high impurity concentration, the external base resistance is reduced and the uniformity and reproducibility of a high performance HBT are improved. Since surface flattening and exposure of the emitter electrode are carried out by an ECR CVD process, a low resistance metal can be deposited on the refractory metal emitter with high reproducibility. In addition, performance is improved by a reduction in the emitter resistance. The wiring process can be simplified by flattening, increasing integration density.

Figure 4:
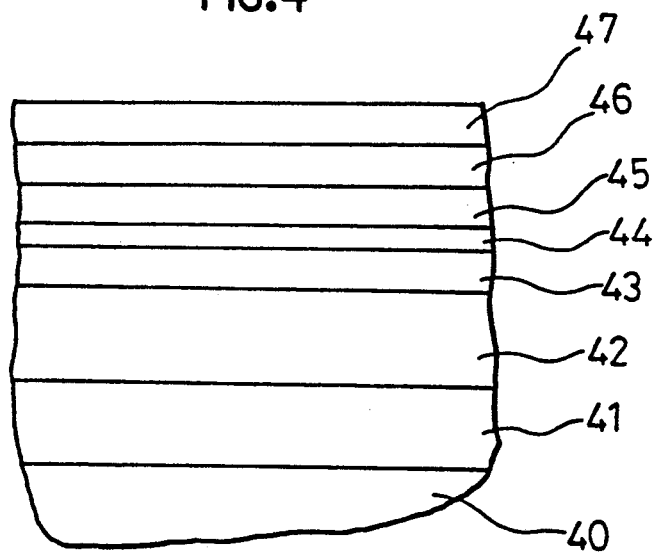
FIG. 4 is a cross-sectional view of an epitaxial growth structure according to another embodiment of the present invention.

While in the above-illustrated embodiment a GaAs series HBT utilizing a semi-insulating GaAs substrate is described, the present invention may also be applied to an InP series HBT utilizing an InP substrate. The epitaxial growth structure of the InP series HBT is shown in FIG. 4 including a semi-insulating InP substrate 40. An $n^{30}$-type InGaAs sub-collector layer 41 having a thickness of about 7,000 Angstroms and an impurity concentration of $1\times10^{19}$ cm$^{-3}$ is disposed on the substrate 40. An n-type InGaAs sub-collector layer 42 about 6,000 Angstroms thick is disposed on the sub-collector layer 41. A p+-type InGaAs layer 43 having a thickness of about 1,000 Angstroms and an impurity concentration of about $1\times10^{19}$ cm$^{-3}$ is disposed on the sub-collector layer 42. An n-type InGaAs spacer layer 44 having a thickness of about 200 Angstroms and an impurity concentration of about $5\times10^{17}$ cm$^{-3}$ is disposed on the base layer 43. An n-type InAlAs emitter layer 45 having a thickness of about 1,500 Angstroms and an impurity concentration of about $5\times10^{17}$ cm$^{-3}$ is disposed on the spacer layer 44. An n+-type InGaAs second cap layer 47 having a thickness of about 1,000 Angstroms and an impurity concentration of about $1\times10^{19}$ cm$^{-3}$ is disposed on the emitter layer 45. An n+-type InGaAs first cap layer 47 having a thickness of about 1,500 Angstroms and an impurity concentration of about $1\times10^{19}$ cm$^{-3}$ is disposed on the second cap layer 46.

While in the above-illustrated embodiment solid phase diffusion is achieved by annealing a doped oxide to produce an external base region, annealing by heating with infrared lamps after depositing a film by sputtering, an open tube diffusion from Zn vapor, or another diffusion method may be employed.

The epitaxial growth structure is, of course, not restricted to the structure of FIG. 1(a).

As is evident from the foregoing description, according to the present invention, an n+-type InGaAs layer is produced at an upper surface of the device and an emitter electrode of a refractory metal is produced by selective etching of this InGaAs layer. Therefore, the emitter electrode can be precisely and uniformly patterned with a high degree of reproducibility.

Since diffusion of a p-type dopant is self-aligning using the emitter electrode as a mask, thereby producing a high impurity concentration external base region, the external base resistance can be reduced and a high performance HBT is produced with a high degree of uniformity and good reproducibility.

Since layer flattening and exposure of the emitter electrode is carried out in an ECR CVD process, a low resistance metal can be deposited on a refractory metal emitter electrode with a high degree of reproducibility. Therefore, the emitter resistance is reduced, improving performance.

Furthermore, because of the flattening and exposure of the emitter electrode by the ECR CVD process, processes performed later, such as wiring, can be simplified, thereby resulting in a variety of effects, increasing integration density.

What is claimed is:

1. A method of producing a semiconductor device comprising:
    epitaxially growing a plurality of layers of GaAs and AlGaAs and n+ type InGaAs layer as the final layer;
    producing a refractory metal emitter electrode on and making ohmic contact with said InGaAs layer without alloying;
    selectively etching said n+ type InGaAs layer using said emitter electrode as a mask;
    depositing a first insulating film on said emitter electrode and n+ type layer and forming side walls on the side surfaces of said emitter electrode and said n+ type InGaAs layer by anisotropic etching of the insulating film;
    depositing a doped oxide on the surface exposed by the selective etching of said n+ type InGaAs layer;
    selectively diffusing dopants from said doped oxide into said layers using said emitter electrode and said side walls as a diffusion mask to form an external access to a base region in said layer;
    converting portions of said base region into electrically insulating regions by ion implantation using a photoresist mask;
    depositing a second insulating film on said emitter electrode and selectively etching the second insulating film to expose a surface of said emitter electrode;
    forming at least one opening in the second insulating film isolated from said emitter electrode, exposing said base region; and
    depositing a metal base contact in the opening contacting said base region.

2. A method of producing a semiconductor device as defined in claim 1 comprising depositing a low resistance metal on said emitter electrode after exposure of the surface of said emitter electrode.

3. A method of producing a semiconductor device as defined n claim 2 wherein said low resistance metal comprises Ti/Au.

4. A method of producing a semiconductor device as defined in claim 1 wherein said refractory metal is selected from the group consisting of W and WSi.

5. A method of producing a semiconductor device as defined in claim 1 including growing said epitaxial structure by one of molecular beam epitaxy and metal oxide chemical vapor deposition.

6. A method of producing a semiconductor device as defined in claim 1 including producing said emitter electrode by sequentially sputtering and RIE using a mixture of $CF_4 + O_2$.

7. A method of producing a semiconductor device as defined in claim 1 including selectively etching said n+ layer with a concentrated HCl solution or a gaseous chlorine compound.

8. A method of producing a semiconductor device as defined n claim 1 wherein said first insulating film is SiO including anisotropic anisotropically etching using a mixture of $C_2F_6 + CHF_3 + O_2 + He$.

9. A method of producing a semiconductor device as defined in claim 1 including depositing a layer of SiN before depositing said first insulating film comprising SiO and RIE said SiN film using a mixture of $CHF_3 + O_2$.

10. A method of producing a semiconductor device as defined in claim 1 including leaving said first insulating film in place where diffusion is not required after production of said side walls.

11. A method of producing a semiconductor device as defined in claim 1 wherein said doped oxide is $ZnO/SiO_2$.

12. A method of producing a semiconductor device as defined in claim 1 wherein said dopant is Zn including thermally diffusing the dopant from said doped oxide film.

13. A method of producing a semiconductor device as defined in claim 1 including implanting at least one of $B^+$ and $H^+$ ions to convert portions of said base region.

14. A method of making a heterojunction bipolar transistor comprising:
    successively epitaxially growing on a semiconductor substrate an n type collector, at least one graded p type AlGaAs layer for forming a base, an n type AlGaAs emitter layer, and n+ type InGaAs cap layer;
    depositing and patterning a refractory metal emitter electrode on the cap layer;
    depositing a first electrically insulating film on the cap layer and emitter electrode;
    selectively etching the first electrically insulating layer and the epitaxial graded layer to leave the first electrically insulating film on side walls of the emitter electrode and to expose the graded n type AlGaAs layer for forming a base and to expose a top surface on the emitter electrode;
    depositing a p type dopant source film on the exposed emitter electrode and graded layer;
    diffusing impurities from the dopant source film into the graded layer to form a p type base region self-aligned with the emitter electrode;
    removing the dopant source film and depositing a second electrically insulating film to flatten the exposed surface of the device;
    selectively etching the second insulating film to expose the top surface of the emitter electrode;
    forming at least one opening in the second insulating film isolated from the emitter electrode exposing the base region; and
    depositing a metal base contact in the opening on the base region.

15. The method of claim 14 including depositing the second electrically insulating film by ECR CVD.

* * * * *